United States Patent
Tanaka et al.

(10) Patent No.: US 6,828,879 B2
(45) Date of Patent: Dec. 7, 2004

(54) LONGITUDINAL COUPLED MULTIPLE MODE SURFACE ACOUSTIC WAVE FILTER

(75) Inventors: Naoki Tanaka, Osaka (JP); Tatsuro Usuki, Osaka (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 10/073,895

(22) Filed: Feb. 14, 2002

(65) Prior Publication Data
US 2002/0113668 A1 Aug. 22, 2002

(30) Foreign Application Priority Data

Feb. 16, 2001 (JP) .......................... 2001-039418
Jan. 24, 2002 (JP) .......................... 2002-016189

(51) Int. Cl.⁷ .............................................. H03H 9/64
(52) U.S. Cl. .................... 333/195; 333/193; 310/313 B
(58) Field of Search ............................... 333/193–196; 310/313 R, 313 B, 313 C, 313 D

(56) References Cited

U.S. PATENT DOCUMENTS

| | | | |
|---|---|---|---|
| 5,568,002 A | * 10/1996 | Kawakatsu et al. | ..... 310/313 B |
| 5,694,096 A | * 12/1997 | Ushiroku et al. | ........... 333/195 |
| 5,835,990 A | 11/1998 | Saw et al. | ............... 310/313 D |
| 5,853,990 A | 12/1998 | Winger et al. | .................. 435/6 |
| 5,874,868 A | * 2/1999 | Shimoe | ....................... 333/193 |
| 6,081,172 A | * 6/2000 | Strauss et al. | ............... 333/193 |
| 6,420,946 B1 | * 7/2002 | Bauer et al. | ................. 333/193 |
| 6,556,100 B2 | * 4/2003 | Takamine | .................... 333/133 |

FOREIGN PATENT DOCUMENTS

| | | |
|---|---|---|
| DE | WO 98/57428 | 6/1998 |
| DE | 198 18 038 A1 | 11/1999 |
| DE | 101 35 953 A1 | 2/2002 |
| EP | 1 152 529 A2 | 11/2001 |
| EP | 1 168 612 A2 | 1/2002 |
| EP | 1 168 613 A2 | 1/2002 |
| EP | 1 211 805 A2 | 6/2002 |
| EP | 1 251 638 A2 | 10/2002 |
| EP | 1 280 274 A2 | 1/2003 |

(List continued on next page.)

OTHER PUBLICATIONS

European Search Report dated Jul. 23, 2003.
Communication from the European Patent Office dated May 9, 2003 transmitting a copy of the European Search report for application No. EP 02 00 3579.
English Translation of Notification of Reason for Refusal received from the Japanese Patent Office dated Jun. 8, 2004 for the corresponding Japanese Patent Application No.: 2002–038697.

*Primary Examiner*—Barbara Summons
(74) *Attorney, Agent, or Firm*—Westerman, Hattori, Daniels & Adrian, LLP

(57) ABSTRACT

The present invention provides an unbalanced input and balanced output type SAW filter capable of obtaining stopband attenuation approximately equivalent to that of an unbalanced input and unbalanced output type SAW filter. IDTs (12) (13) are respectively disposed on each side of a middle IDT (11). A comb electrode (11c) of the middle IDT (11) is connected with an input terminal (In) and other comb electrode (11b) is grounded. A comb electrode (12c) of the IDT (12) and a comb electrode (13b) of the IDT (13) are respectively connected with output terminals (Out 1) and (Out 2), and other comb electrode (12b) of the IDT (12) and other comb electrode (13c) of the IDT (13) are connected to each other and grounded. Electrode fingers (11a), (12a), (13a) of the middle IDT (11) and the side IDT (12), (13) are so arranged that adjacent electrode fingers of the middle IDT and the IDT on one side make a connection between terminals and the other adjacent electrode fingers of the middle IDT and the IDT on other side make a connection between a terminal and a ground.

17 Claims, 10 Drawing Sheets

FOREIGN PATENT DOCUMENTS

| | | | |
|---|---|---|---|
| JP | 53-131737 | | 11/1978 |
| JP | 64-019815 | | 1/1989 |
| JP | 07-030367 | | 1/1995 |
| JP | 7-307641 | * | 11/1995 |
| JP | 9-8599 | * | 1/1997 |
| JP | 10-65481 | * | 3/1998 |
| JP | 10-135780 | * | 5/1998 |
| JP | 10-163792 | * | 6/1998 |
| JP | 2002-528987 | | 9/2002 |
| WO | WO 00/25423 | * | 5/2000 |
| WO | WO 02 47264 A1 | | 6/2002 |
| WO | WO 03 001667 A1 | | 1/2003 |

* cited by examiner

Width between the input IDT and the output IDT

LONGITUDINAL COUPLED MULTIPLE MODE SURFACE ACOUSTIC WAVE FILTER

BACKGROUND OF THE INVENTION

1. Field of the Invention

This invention relates to a surface acoustic wave filter (thereinafter to be referred to as an SAW filter).

2. Description of Prior Art

An SAW filter is a small and thin filter utilizing a surface acoustic wave and is in practical use as a key device for mobile communication equipments such as cellular phones. With the recent demands for a miniaturized, high-frequency cellular phone requiring low power consumption for a long-duration of call, there has been a growing demands for higher frequency SAW filters with lower insertion loss and higher power handling capability.

FIG. 22 is a schematic plan view illustrating a longitudinal coupled double mode SAW filter utilizing a conventional primary-third order longitudinal mode. The SAW filter in FIG. 22 shows also an unbalanced input and unbalanced output type SAW filter. On a main surface of a piezoelectric substrate, as shown in FIG. 22, there are provided three IDTs (Interdigital Transducer) 61, 62, 63 closely disposed to each other along a propagation direction of a surface wave, with grating reflectors (hereinafter to be referred to as reflector) 64a, 64b disposed on both sides of these IDTs. The IDTs 61, 62, 63 are structured by comb electrodes 61b, 61c, 62b, 62c, 63b, 63c having a plurality of electrode fingers 61a, 62a, 63a, with each electrode finger inserted into a space of the other comb electrode. A comb electrode 61b of the IDT 61 is connected with an input terminal In and the other comb electrode 61c is grounded. A comb electrode 62b of the IDT 62 and a comb electrode 63b of the IDT 63 are mutually connected with each other and are connected to an output terminal Out. The other comb electrode 62c of the IDT 62 and the other comb electrode 63c of the IDT 63 are mutually connected with each other and are grounded.

The SAW filter shown in FIG. 22 operates as follows as known. A plurality of surface waves excited by the IDTs 61, 62, 63 are trapped between the reflectors 64a and 64b, and a coupling is generated among the IDTs 61, 62, and 63. As a result, two longitudinally coupled resonance modes of primary and third-order are excited strongly through the electrode pattern, and the filter works as a double mode SAW filter utilizing these two modes by giving appropriate terminations. It is known that a pass-band width of the double mode SAW filter is proportional to a frequency difference between the primary-order resonance mode and the third-order resonance mode.

FIG. 23 shows another longitudinal coupled double mode SAW filter with an unbalanced input and balanced output configuration. On a main surface of a piezoelectric substrate, as shown in FIG. 23, there are provided three IDTs 71, 72, 73 closely disposed to each other along a propagation direction of a surface wave, with reflectors 74a, 74b disposed on both sides of these IDTs. The IDTs 71, 72, 73 are structured by comb electrodes 71b, 71c, 72b, 72c, 73b, 73c having a plurality of electrode fingers 71a, 72a, 73a, with each electrode finger inserted into a space of the other comb electrode. A comb electrode 71b of the IDT 71 and a comb electrode 72b of the IDT 72 are mutually connected with each other and are connected with an input terminal In. The other comb electrode 71c of the IDT 71 and the other comb electrode 72c of the IDT 72 are mutually connected with each other and are grounded. A comb electrode 73c of the IDT 73 is connected with an output terminal Out 1 and the other comb electrode 73b is connected with an output terminal Out 2.

FIGS. 24 and 25 show filtering properties of the longitudinal double mode SAW filter comprising a middle IDT including 27 electrode fingers, side IDTs including 19 electrode fingers each and reflectors including 120 electrode fingers each on a 36-degree Y-cut X-propagation $LiTaO_3$ substrate, and assuming an aperture length of 80 $\mu$m and a wavelength $\lambda$ of 2.14 $\mu$m. FIG. 24 shows properties of the unbalanced input and unbalanced output type SAW filter in FIG. 22. FIG. 25 shows properties of the 50 $\Omega$ unbalanced input and 50 $\Omega$ balanced output type SAW filter in FIG. 23. A horizontal axis indicates frequency (GHz), takes 1.925 at the middle and is marked in 0.375 GHz increments. A vertical axis indicates an insertion loss and is marked in 10 dB decrements.

Even though the unbalanced input and balanced output type SAW filter can be provided with two output terminals Out, as can be seen from FIGS. 24 and 25, stop-band attenuation of the SAW filter is lower than that of an unbalanced input and unbalanced output type SAW.

The present invention was made to solve the above problem and has an objective to provide an unbalanced input and balanced output type SAW filter capable of obtaining stop-band attenuation approximately equivalent to that of an unbalanced input and unbalanced output type SAW filter.

Also the present invention has an objective to provide an SAW filter which can be fabricated readily when the width between an input IDT and an output IDT is less than $\lambda/2$.

SUMMARY OF THE INVENTION

This invention was made to provide a longitudinal coupled multiple mode SAW filter comprising a plurality of IDTs disposed along a propagation direction of a surface wave on a piezoelectric substrate. In the SAW filter, an IDT is flanked on either side by IDTs, one of comb electrodes of IDT in the middle is connected with an input terminal, other comb electrode of the middle IDT is grounded, one of comb electrodes of IDT on each side of the middle IDT is connected with an output terminal, other comb electrodes of the side IDT are grounded. Electrode fingers are so arranged that adjacent electrode fingers of the middle IDT and the IDT on one side makes a connection between terminals or a connection between grounds and the other adjacent electrode fingers of the middle IDT and the IDT on the other side makes a connection between a terminal and a ground.

The SAW filter can be so structured that the output terminals are formed facing one direction and the grounds are also established facing one direction.

Also the SAW filter may be so structured that the output terminals are mutually formed in the opposite directions.

With the above mentioned structure, an unbalanced input and balanced output SAW filter can improve stop-band attenuation.

Also, the SAW filter of the present invention comprises an resonator, which includes one or a plurality of IDTs for exciting and receiving a surface acoustic wave and has antiresonant frequency approximately equivalent to cut-off frequency on the high-pass side of the longitudinal coupled multiple mode SAW filter. The resonator is connected with the input terminal of the SAW filter in series and is provided with an input terminal at the IDT.

The longitudinal coupled multiple mode SAW filter of the present invention comprises two reflectors on both sides of a plurality of IDTs along the propagation direction of the surface wave. These reflectors may reflect the surface wave and trap oscillation energy of the surface wave in between.

The resonator is a one-port resonator and may comprise two reflectors on both sides of one or a plurality of IDTs along the propagation direction of the surface wave. These reflectors may reflect the surface acoustic wave.

When alternating voltage is applied between the input terminal and the output terminal, stress is created between adjacent electrode fingers of the one-port SAW resonator on the piezoelectric substrate by the piezoelectric effect and the surface acoustic wave is excited. By reflecting the exciting surface acoustic wave between two reflectors, the oscillation energy of the wave is trapped between the reflectors, as a result standing wave is generated. The one-port resonator has antiresonant frequency. By connecting the longitudinal coupled multiple mode SAW filter and the one-port resonator in series and matching the cut-off frequency on the high-pass side of the longitudinal coupled multiple mode SAW filter with the antiresonant frequency of the one-port resonator, the roll-off in vicinity of the cut-off frequency on the high-pass side can be made steeper.

In the longitudinal coupled multiple mode SAW filter of the present invention, the width of adjacent electrode fingers of the input IDT and the output IDT may be designed to be smaller than the width of the other electrode fingers.

When the SAW filter operates higher frequency, the space between the input IDT and the output IDT should be designed to be less than $\lambda/2$. Consequently a space between the adjacent electrode fingers of the IDTs becomes narrow, resulting in difficulties in fabrication. In this case, the certain width between the input IDT and the output IDT can be left by designing the width of the adjacent electrode fingers of the input IDT and the output IDT to be smaller than the width of the other electrode fingers, resulting in easy manufacture.

In the longitudinal coupled multiple mode SAW filter of the present invention, the width of adjacent electrode fingers of the input IDT and the output IDT is designed to be smaller than the width of the other electrode and the pitch between one of the adjacent electrode fingers is designed to be narrower than the pitch between the other electrode fingers. Moreover, the width of a plurality of the electrode fingers of the input IDT and the output IDT may be designed to be smaller than the width of the other electrode fingers.

With the above mentioned structure, a certain width between the input IDT and the output IDT can be left even if the frequency becomes further higher, resulting in easy manufacture.

This invention was made to provide a longitudinal coupled multiple mode SAW filter comprising a plurality of IDTs disposed along a propagation direction of a surface wave on a piezoelectric substrate. In the SAW filter, an IDT is flanked on either side by IDTs, one of comb electrodes of the middle IDT is connected with an input terminal, one of comb electrodes of the IDT on each side of the middle IDT is connected with an output terminal, the width of adjacent electrode fingers of the input IDT and the output IDT is designed to be smaller than the width of the other electrode and the pitch between adjacent electrode fingers is designed to be narrower than the pitch between the other electrode fingers.

This invention was made to provide a longitudinal coupled multiple mode SAW filter comprising a plurality of IDTs disposed along a propagation direction of a surface wave on a piezoelectric substrate. In the SAW filter, an IDT is flanked on either side by IDTs, one of comb electrodes of the middle IDT is connected with an input terminal, one of comb electrodes of the IDT on each side of the middle IDT is connected with an output terminal, the width of adjacent electrode fingers of the input IDT and the output IDT is designed to be smaller than the width of the other electrode and the pitch between adjacent electrode fingers is designed to be narrower than the pitch between the other electrode fingers. Moreover, the width of a plurality of the electrode fingers of the input IDT and the output IDT may be designed to be smaller than the width of the other electrode fingers

The foregoing and other objects, features, aspects and advantages of the present invention will become more apparent from the following detailed description of the present invention when reviewed in conjunction with the accompanying drawings.

DESCRIPTION OF PREFERRED EMBODIMENTS

Embodiments of the present invention will be explained below with reference to the drawings.

Figure 1:
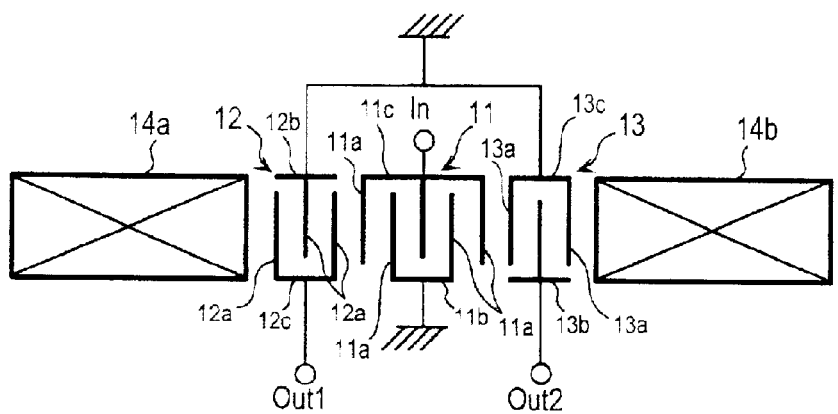
FIG. 1 is a schematic plan view illustrating a longitudinal coupled double mode SAW filter utilizing a longitudinal double mode according to a first embodiment of the present invention.

FIG. 1 is a schematic plan view illustrating a longitudinal coupled double mode SAW filter utilizing a longitudinal double mode according to a first embodiment of the present invention.

The longitudinal coupled double mode SAW filter has an unbalanced input and balanced output configuration and comprises three IDTs 11, 12, 13 disposed closely to each other along a propagation direction of surface wave on a main surface of a piezoelectric substrate, and reflectors 14a and 14b disposed on both sides of the IDTs.

The IDTs 11, 12, 13 are respectively structured with comb electrodes 11b, 11c, 12b, 12c, 13b, 13c having a plurality of electrode fingers 11a, 12a, 13a, with each electrode finger inserted into a space of the other comb electrode. A comb electrode 11c of the middle IDT 11 is connected with an input terminal In and the other comb electrode 11b is grounded. A comb electrode 12b of the IDT 12 and a comb electrode 13c of the IDT 13 are mutually connected with each other and grounded. The other comb electrode 12c of the IDT 12 and the other comb electrode 13b of the IDT 13 are respectively connected with an output terminal Out 1 and an output terminal Out 2.

Each of reflectors 14a, 14b is structured with a large number of electrode fingers (not shown) like the electrode fingers of the IDTs 11, 12, 13. The electrode fingers are spaced at approximately the same intervals as the electrode fingers of the IDTs 11, 12, 13 and arranged in ladder shape.

Although aperture lengths, which are length orthogonal to the propagation direction of surface acoustic wave, of each of three IDTs 11, 12, 13 and the reflectors 14a, 14b are almost the same, they are not necessarily same.

According to the longitudinal coupled double mode SAW filter in this invention, as shown in FIG. 1, adjacent electrode fingers 11a of the middle IDT and 12a of the IDT 12 on one side of the IDT 11, and adjacent electrode fingers 11a of the middle IDT and 13a on the other side of the IDT 11 are arranged as follows; adjacent electrode fingers establish a hot and hot connection, that is, one electrode finger of the adjacent electrode fingers is connected with an output terminal (or an input terminal) and the other electrode finger is connected with an input terminal (or an output terminal). The other adjacent electrode fingers establish a hot and ground connection, that is, one finger of the adjacent electrode fingers is connected with an output terminal (or an input terminal) and the other finger is grounded.

In the embodiment shown in FIG. 1, a comb electrode 12c of the IDT 12 is connected with an output terminal Out 1, that is, an electrode finger 12a of the comb electrode 12c is connected with the output terminal Out 1. The comb electrode 11c of the middle IDT 11 having the electrode finger 11a adjacent to the electrode finger 12a of the comb electrode 12c is connected with an input terminal In, that is, the electrode finger 11a of the comb electrode 11c is connected with the input terminal In. This connection of the adjacent fingers is referred to as the hot and hot connection. On the other hand, the other comb electrode 12b of the IDT 12 and the other comb electrode 11b of the IDT 11 are grounded. In other words, an electrode finger 11a comprising the comb electrode 11b and an electrode finger 12a comprising the comb electrode 12b are grounded.

A comb electrode 13c of the IDT 13 is grounded, that is, an electrode finger 13a comprising the comb electrode 13c is grounded. The comb electrode 11c of the middle IDT having an electrode finger 11a adjacent to the electrode finger 13a of the comb electrode 13c is grounded. This connection of the adjacent electrode fingers 11a and 13a of the IDTs 11 and 13 is referred to as the hot and ground connection. On the other hand, the other comb electrode 13b of the IDT 13 is connected with an output terminal Out 2. In other words, an electrode finger 13a comprising the comb electrode 13b is connected with the output terminal Out 2.

Figure 2:
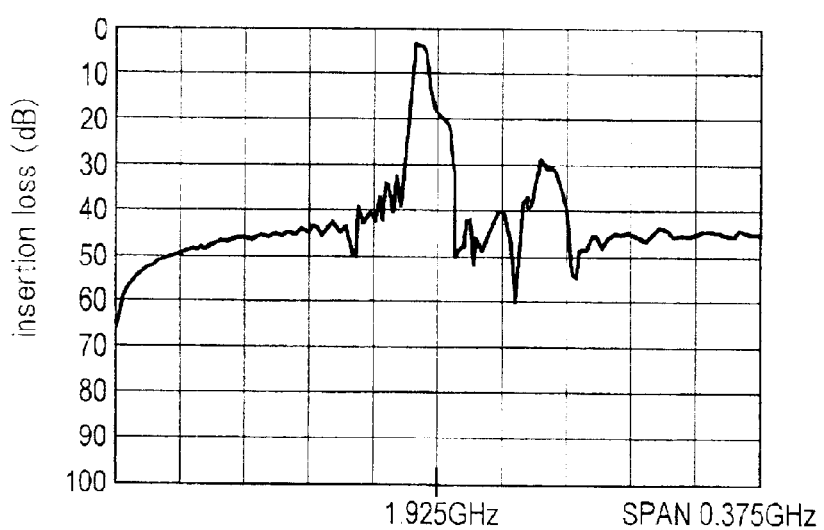
FIG. 2 is a view showing filtering property of a prototype of a longitudinal coupled double mode SAW filter using an electrode configuration of the present invention.
Figure 3:
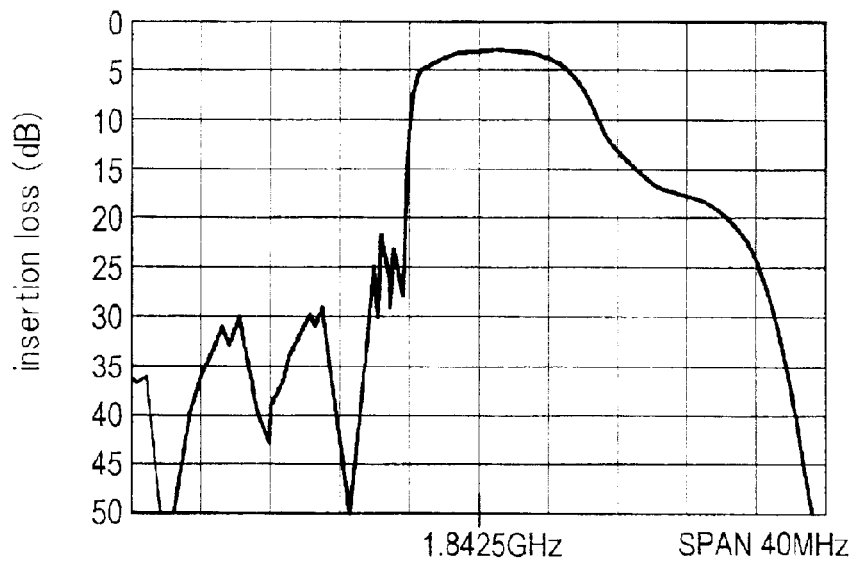
FIG. 3 is a view showing filtering property, which measured in the vicinity of the pass-band, of the prototype of the longitudinal coupled double mode SAW filter using the electrode configuration of the present invention.

FIGS. 2 and 3 are views showing filtering property of a longitudinal coupled double mode SAW filter comprising the middle IDT 11 including 27 electrode fingers, the side IDTs 12 and 13 including 19 of electrode fingers each, reflectors 14a and 14b including 120 electrode fingers each on a 36-degree Y-cut X-propagation LiTaO$_3$ substrate. These IDTs respectively have an aperture length of 80 μm, a wavelength λ of 2.14 μm, and a duty ratio of 65. The reflectors respectively have an aperture length of 80 μm, a wavelength λ of 2.19 μm and a duty ratio of 65. The IDTs and the reflectors are made of Al or Al—Cu(1%). The thickness of the IDTs and the reflectors is in a range between 150–200 nm. In this embodiment, the thickness is 170 nm. The IDT inputs 50 Ω and outputs 150 Ω so that an unbalanced input and balanced output configuration is formed.

This embodiment indicates the longitudinal coupled double mode SAW filter for a pass-band in a range of 1805 MHz to 1880 MHz. A horizontal axis of a graph in FIG. 2 indicates frequency (GHz), takes 1.925 GHz in its middle and is marked in 0.375 GHz increments. A vertical axis indicates an insertion loss and is marked in 10 dB decrements. FIG. 3 is a scaled-up graph indicating a value in the vicinity of the pass-band. A horizontal axis indicates a frequency (GHz), takes 1.8425 GHz in its middle and is marked in 40 MHz increments. A vertical axis indicates an insertion loss and is marked in 5 dB decrements.

Figure 24:
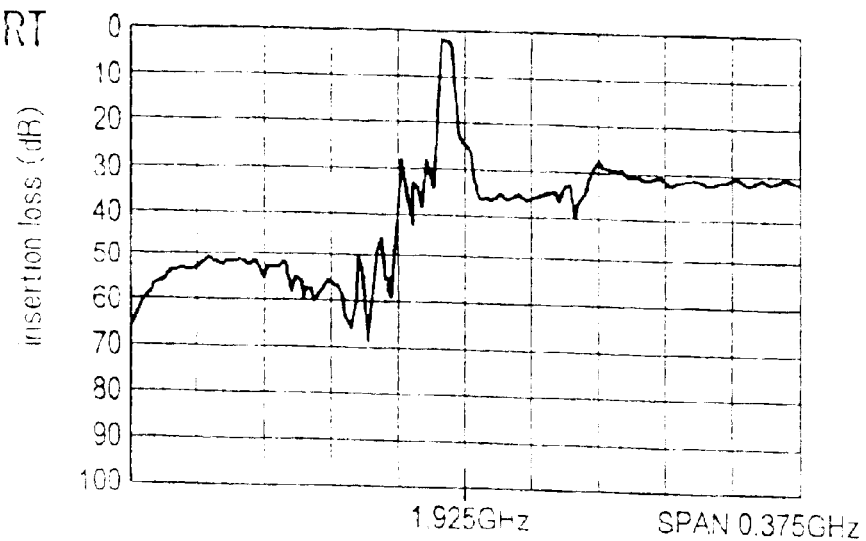
FIG. 24 is a view showing filtering property, which is measured in the vicinity of the pass-band, of a prototype of the longitudinal coupled double mode SAW filter using the electrode configuration shown in FIG. 22.
Figure 25:
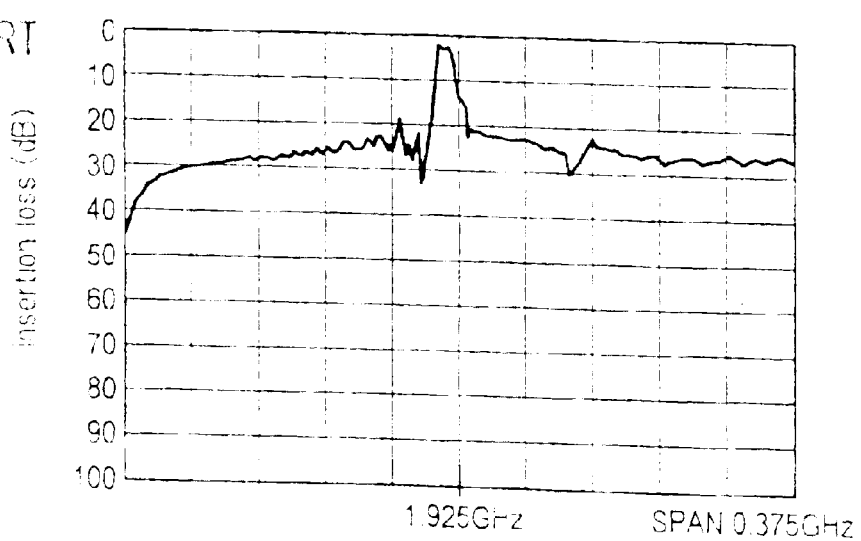
FIG. 25 is a view showing filtering property, which is measured in the vicinity of the pass-band, of a prototype of the longitudinal coupled double mode SAW filter using an electrode configuration shown in FIG. 23.

As shown in FIGS. 2 and 3, the SAW filter in this embodiment demonstrates the superiority in attenuation at a low side and a high side of the pass-band over the SAW filter shown in FIG. 25. Also the SAW filter in this embodiment can obtain attenuation almost equivalent to that of an unbalanced input and unbalanced output type SAW filter shown in FIG. 24.

Although, a 36-degree Y-cut X-propagation $LiTaO_3$ substrate is used as a piezoelectric substrate in the embodiment described above, widely used piezoelectric substrates as a substrate for the SAW filter are also available; for example, a 64-degree Y-cut X-propagation $LiNbO_3$ substrate, a 41-degree Y-cut X-propagation $LiNbO_3$ substrate, a 42-degree Y-cut X-propagation $LiTaO_3$ substrate and a 128-degree Y-cut Y-propagation $LiNbO_3$ substrate, further an X-cut $LiTaO_3$ substrate, an X-cut $LiNbO_3$ substrate. The other types of piezoelectric material such as quartz or langasite are also available. Furthermore, thin film piezoelectric materials such as AlN (Aluminum Nitrogen), ZnO (Zinc Oxide), $PbTiO_3$ or $BaTiO_3$ can be used for the piezoelectric substrate instead of mono-crystal material.

Au or Cu, or a laminated film thereof can be used as materials for the IDT and the reflector instead of materials described above.

Although the embodiment indicates the SAW filter for 1800–1900 MHz, an SAW filter for 1710–1785 MHz can be formed with the similar design parameters used in the above SAW filter. In RF and IF band for mobile communication system, especially in 300–500 MHz, 800–900 MHz, 1500 MHz or 1.9–2.0 GHz, or in a band of 2.4–2.5 GHz or 5 GHz for a wireless LAN system, the SAW filter can obtain the same properties as cited above by modifying the design parameters.

One of required filtering properties is based on a pass-band width of frequency. The pass-band width depends on a period which is determined by width and space of electrode fingers and a wavelength which is determined by acoustic velocity of the piezoelectric material under the condition that the relative bandwidth which is standardized by the bandwidth and frequency is fixed. By making the period smaller and using materials of which acoustic wave can travel faster, the pass-band can be shifted to the higher frequency.

In this embodiment, the shift amount (75 MHz to 1842.5 MHz) is 4.1 percent. The design parameter includes a film's thickness, a duty ratio of IDT, the number of electrode fingers of the middle IDT and the side IDTs, and the distance between adjacent IDTs and these parameters are adjusted to design filters.

The bandwidth can be varied depending on an electromechanical coupling coefficient ($k^2$) possessed by the piezoelectric substrates. To carry this out, the design parameter of electrodes should be modified.

By using a piezoelectric substrate having a greater electromechanical coupling coefficient and decreasing the number of electrode fingers of the IDT, the bandwidth generally can be made wider to obtain basic filtered waveforms. Also the bandwidth can be made wider by making the film thickness larger.

The filtering properties as indicated in this invention can be obtained with consideration of materials and the design parameter for electrodes.

Even if the SAW filter operates different frequencies, the longitudinal coupled double mode SAW filter used in this invention basically can be formed by changing materials, the number of electrode fingers of the IDT and the design parameter for the electrodes whenever the relative bandwidth is in a range between about 0.1–10 percent.

The longitudinal coupled double mode SAW filter can obtain excellent filtering properties inherent in the unbalanced and balanced type filter by applying the structure in this embodiment.

As described above, the longitudinal coupled double mode SAW filter can obtain various filtering properties by modifying the design parameter. However, it is generally said that a roll-off in the vicinity of cut-off frequency on the high-pass side of the pass-band is not steep. Therefore a longitudinal coupled double mode SAW filter comprising a one-port SAW resonator connected therewith in series has been put forth in order to make the roll-off in the vicinity of cut-off frequency on the high-pass side of the pass-band steeper.

Figure 4:
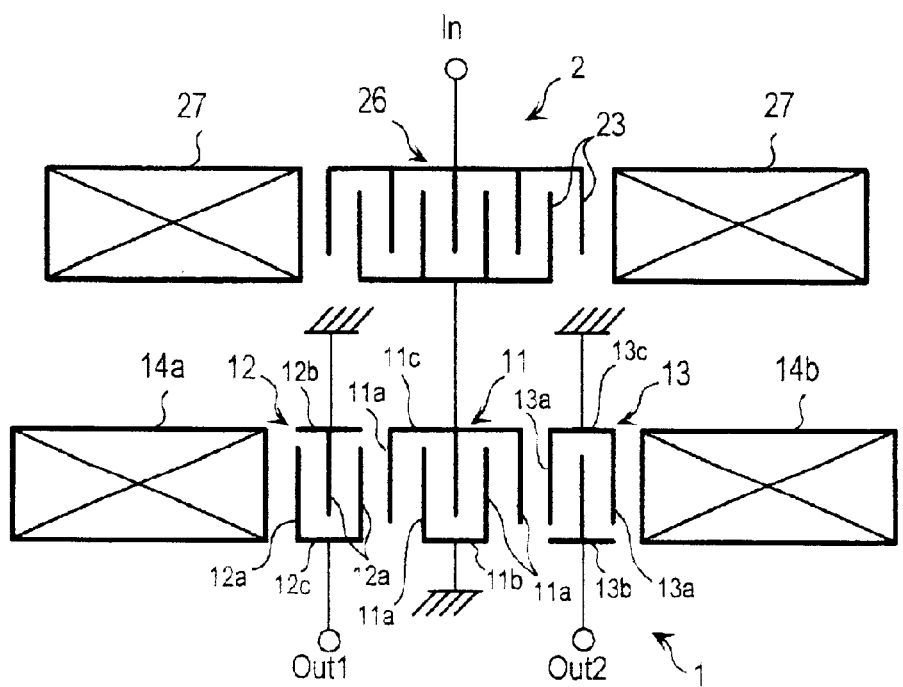
FIG. 4 is a schematic plan view showing a second embodiment where a one-port SAW resonator is connected in series to an input side of the longitudinal coupled double mode SAW filter in FIG. 1.

FIG. 4 is a schematic plan view showing a second embodiment where a one-port SAW resonator is connected in series to an input side of the longitudinal coupled double mode SAW filter in FIG. 1. In FIG. 4, the same components as those in FIG. 1 are given the same reference numbers.

In the embodiment, as shown in FIG. 4, the longitudinal coupled double mode SAW filter 1 is connected in series with a one-port SAW resonator 2 on a piezoelectric substrate.

A comb electrode 12c of an IDT 12 is connected with an output terminal Out 1. A comb electrode 11c of a middle IDT 11 having an electrode finger 11a adjacent to an electrode finger 12a of the comb electrode 12c is connected with the one-port SAW resonator 2. Actually the electrode finger 11a comprising the comb electrode 11c is connected with an input terminal In through the one-port SAW resonator 2. This connection of the adjacent electrode fingers 12a and 11a of the IDTs 11 and 12 is referred to as the hot and hot connection. The other comb electrode 12b of the IDT 12 and the other comb electrode 11b of the IDT 11 are grounded.

A comb electrode 13c of an IDT 13 is grounded. A comb electrode 11c of the middle IDT 11 having an electrode finger 11a adjacent to an electrode finger 13a of the comb electrode 13c is connected with the input terminal In through the one-port SAW electrode 2. This connection of the adjacent electrode fingers 11a and 13a of the IDTs 11 and 13 is referred to as the hot and ground connection. The other comb electrode 13b of the IDT 13 is connected with an output terminal Out 2.

In the one-port SAW resonator 2, two reflectors 27, 27 which reflect surface acoustic wave are disposed along the propagation direction of the surface wave and on both sides of an IDT 26 which excites and receives the surface acoustic wave. The IDT 26 is structured with two comb electrodes having a large number of electrode fingers 23 (simplified in FIG. 4), with each electrode finger 23 of one comb electrode inserted evenly into a space between the electrode fingers 23 of the other comb electrode.

Each of the reflectors 27 is structured with a large number of electrode fingers (not shown) like the electrode fingers 23 of the IDT 26. The electrode fingers are spaced at approximately the same intervals as the IDT 26 to be arranged in ladder shape.

Although aperture lengths, which are orthogonal to the propagation direction of surface acoustic wave, of the IDT 26 and the reflectors 27 are almost the same, it is not necessary that they be the same.

As described above, the comb electrode 11c of the IDT 11 of the longitudinal coupled double mode SAW filter 1 is connected with one of the comb electrodes of the IDT 26 of the one-port SAW resonator 2. An input terminal In for the SAW filter is formed at the other comb electrode of the IDT 26.

When alternating voltage is applied to the input terminal In, stress is created between adjacent electrode fingers 23 of the one-port SAW resonator 2 on the piezoelectric substrate by the piezoelectric effect, as a result a surface acoustic wave is excited. By reflecting the exciting surface acoustic wave between two reflectors 27, standing wave is generated and resonated. The resonated wave is supplied to the longitudinal coupled double mode SAW filter 1 as an output.

In the longitudinal coupled double mode SAW filter, stress is created between the electrode fingers on the piezoelectric substrate by the piezoelectric effect, as a result a surface acoustic wave is excited. The wave is excited the most when the wavelength of the surface acoustic wave is the same as the periodicity (pitch) between electrode fingers. A standing wave is generated and resonated by reflecting the exciting surface acoustic wave between two reflectors 14a, 14b and by trapping the oscillation energy of the wave between the reflectors 14a, 14b. The resonated wave is output from the output terminal Out 1 and Out 2 of the SAW filter 1 as outputs.

Figure 5:
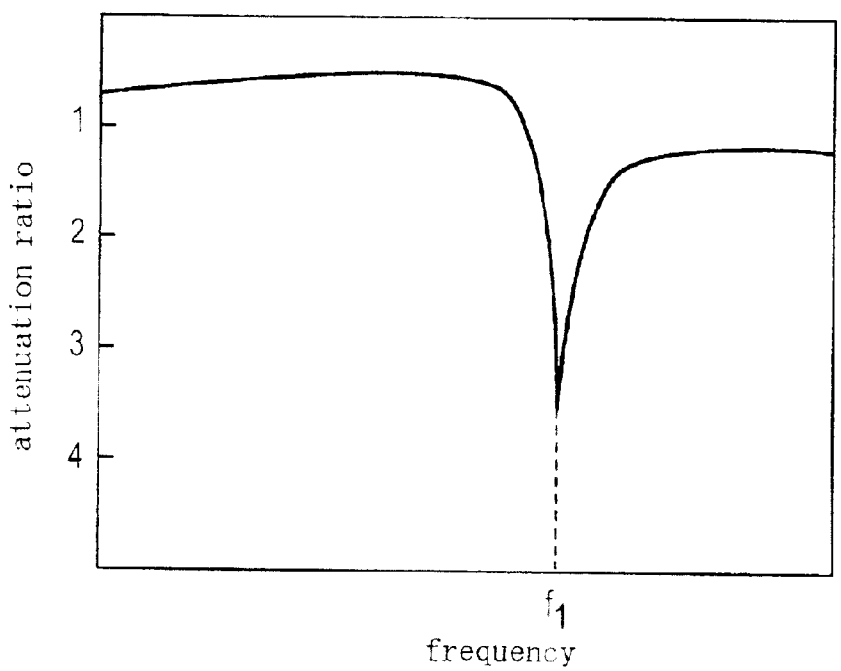
FIG. 5 is a view showing frequency characteristics of the one-port SAW resonator.

The one-port SAW resonator 2 provides filtering properties including an antiresonant frequency f1 as shown in FIG. 5. The antiresonant frequency f1 is in approximate agreement with a cut-off frequency on the high-pass side in the pass-band of the longitudinal coupled double mode SAW filter, which allows the roll-off in the vicinity of the cut-off frequency on the high-pass side to be steeper, as a result the SAW filter can obtain enough attenuation.

Figure 6:
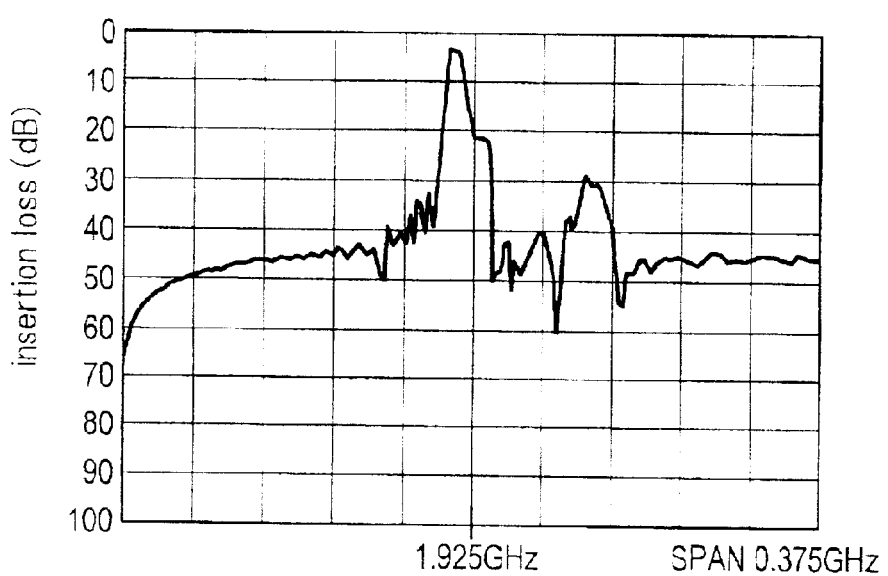
FIG. 6 is a view showing filtering property of a prototype of a longitudinal coupled double mode SAW filter using an electrode configuration of the second embodiment.
Figure 7:
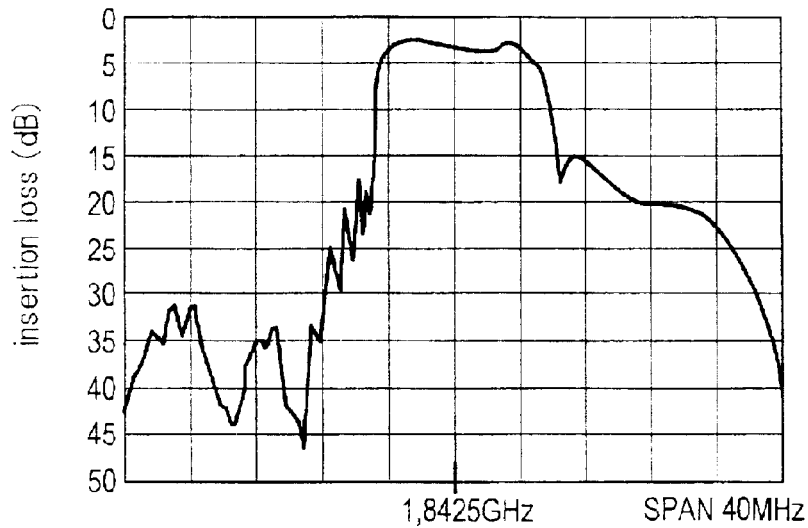
FIG. 7 is a view showing filtering property, which measured in the vicinity of the pass-band, of the prototype of the longitudinal coupled double mode SAW filter using the electrode configuration of the second embodiment.

FIGS. 6 and 7 shows filtering properties of the following SAW filter. A longitudinal double mode SAW filter comprises, a middle IDT 11 including 27 of electrode fingers 11a, side IDTs 12 and 13 each including 19 of electrode fingers 12a and 13a and reflectors 14a, 14b each including 120 electrode fingers on a 36-degree Y-cut X-propagation LiTaO$_3$ substrate. On the same substrate, a one-port SAW resonator 2 comprising an IDT 26 including 251 electrode fingers is connected in series to the input side of the longitudinal coupled double mode SAW filter 1.

The IDT of the longitudinal coupled double mode SAW filter has an aperture length of 80 μm, a wavelength λ of 2.14 μm, duty ratio of 65. The reflector has an aperture length of 80 μm, a wavelength λ of 2.19 μm, duty ratio of 65. The IDTs and the reflectors are made of Al or Al—Cu (1%). The thickness of the IDTs and the reflectors is in a range between 150–200 nm. In this embodiment, the thickness is 170 nm. The IDT inputs 50 Ω and outputs 50 Ω so that an unbalanced input and balanced output configuration is formed.

The IDT of the one-port SAW resonator has an aperture length of 75 μm, a wavelength λ of 2.14 μm, duty ratio of 50. The reflector has an aperture length of 75 μm, a wavelength λ of 2.19 μm, duty ratio of 50. The IDTs and the reflectors are made of Al or Al—Cu (1%). The thickness of the IDTs and the reflectors is in a range between 150–200 nm. In this embodiment, the thickness is 170 nm.

This second embodiment indicates the longitudinal coupled double mode SAW filter for a pass-band in a range between 1805 MHz and 1880 MHz. A horizontal axis of a graph in FIG. 6 indicates frequency (GHz), takes 1.925 GHz in its middle and is marked in 0.375 GHz increments. A vertical axis indicates an insertion loss and is marked in 10 dB decrements. FIG. 7 is a scaled-up graph indicating a value in the vicinity of the pass-band. A horizontal axis indicates a frequency (GHz), takes 1.8425 GHz in its middle and is marked in 40 MHz increment. A vertical axis indicates an insertion loss and is marked in 5 dB decrements.

As shown in FIGS. 6 and 7, the SAW filter in this embodiment demonstrates the superiority in attenuation at a low side and a high side of the pass-band over the SAW filter shown in FIG. 25. Also the SAW filter in this embodiment can obtain attenuation almost equivalent to that of an unbalanced and unbalanced type SAW filter shown in FIG. 24. As compared with FIGS. 2 and 3 to FIGS. 6 and 7, it is apparent that the roll-off in the vicinity of the cut-off frequency on the high-pass side can be steeper by comprising the one-port SAW resonator on the input side of the SAW filter.

Figure 8:
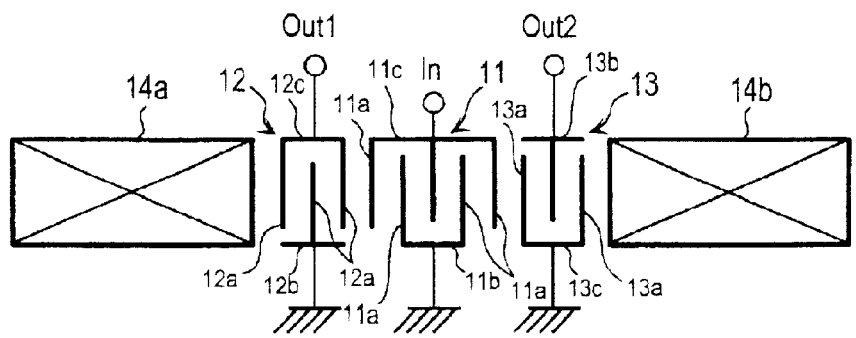
FIG. 8 is a schematic plan view illustrating other electrode configuration of the longitudinal coupled double mode SAW filter utilizing the longitudinal double mode according to the present invention.
Figure 9:
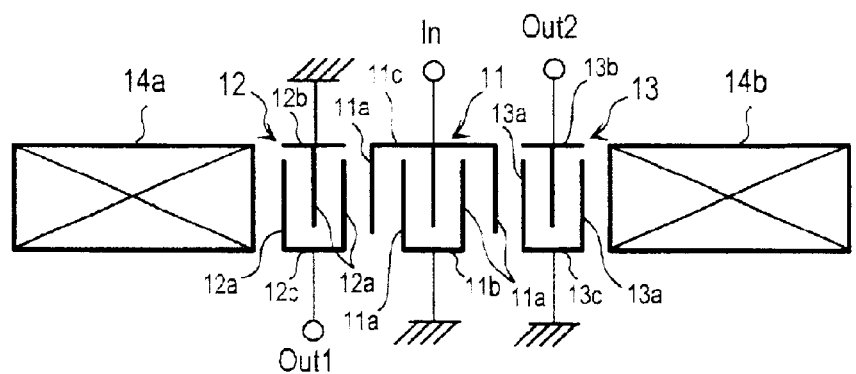
FIG. 9 is a schematic plan view illustrating other electrode configuration of the longitudinal coupled double mode SAW filter utilizing a longitudinal double mode according to the present invention.

According to the SAW filter in this invention, the electrode fingers of the middle IDT 11 and the IDTs 12 and 13 on both sides are so arranged that adjacent electrode fingers establish a connection between an output (input) terminal and an input (output) terminal, and the other adjacent electrode fingers establish a hot and ground connection, that is, one electrode finger of the adjacent electrode fingers is connected with an output (input) terminal and the other electrode finger is grounded. However the other configurations shown in FIGS. 8 and 9 are also available instead of the above mentioned configuration. As to FIGS. 8 and 9, the same components as those in FIG. 1 are given the same reference numbers to omit the explanation.

In a configuration shown in FIG. 8, the electrode fingers of the IDTs are so arranged that the grounds are established in one direction.

In a configuration shown in FIG. 9, the electrode fingers of the IDTs are so arranged that the output terminals Out of the side IDTs are mutually formed in the opposite directions.

In the SAW filter shown in FIGS. 8 and 9, it is possible to make the roll-off in the vicinity of the cut-off frequency on the high-pass side steeper by comprising the one-port SAW resonator on the input side of the SAW filter.

According to the SAW filter in this embodiment, the electrode fingers in the middle IDT 11 and the IDTs 12 and 13 on both sides are so arranged that adjacent electrode fingers establish a hot and hot connection, and the other adjacent electrode fingers establish a hot and ground connection. Also the electrode fingers in the middle IDT 11 and the IDTs 12 and 13 on both sides can be so arranged that adjacent electrode fingers establish a ground and ground connection, and the other adjacent electrode fingers establish a hot and ground connection.

Although the longitudinal coupled double mode SAW filter in the above described embodiment is provided with reflectors, the SAW filter does not always need the reflectors. It is possible to apply an SAW filter without reflectors by changing the number and the arrangement of the IDT or by utilizing a reflection occurring in crystal surfaces.

As a matter of course, the filter does not need to be alone. A plurality of filters can be connected to each other.

The present invention is applicable to not only the longitudinal coupled double mode SAW filter but also a longitudinal coupled multiple mode SAW filter such as a primary-secondary-third order longitudinal coupled triple mode SAW filter.

Figure 10:
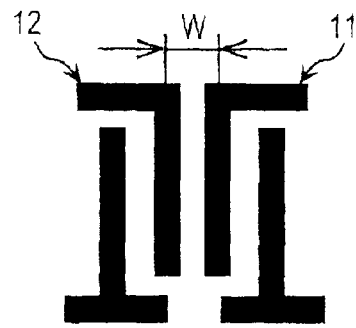
FIG. 10 is a schematic plan view showing a state between an input IDT and an output IDT.

By the way, one of important parameters is a pitch between an input IDT and an output IDT in order to obtain a good pass-band characteristic. It is well known that a good pass-band characteristic can be obtained by making the width W between an input IDT 11 and an output IDT 12 (13) smaller than $\lambda/2$, as shown in FIG. 10. Generally the width W between the input IDT and the output IDT is designed to be less than $\lambda/2$. The pitch between electrode fingers of the IDT is $\lambda/2$.

When the SAW filter operates higher frequency, the space between the input IDT and the output IDT should be designed to be less than $\lambda/2$. Consequently a space between the adjacent electrode fingers of the IDTs becomes narrow; as a result the SAW filter needs highly advanced processing technology to manufacture.

Figure 11:
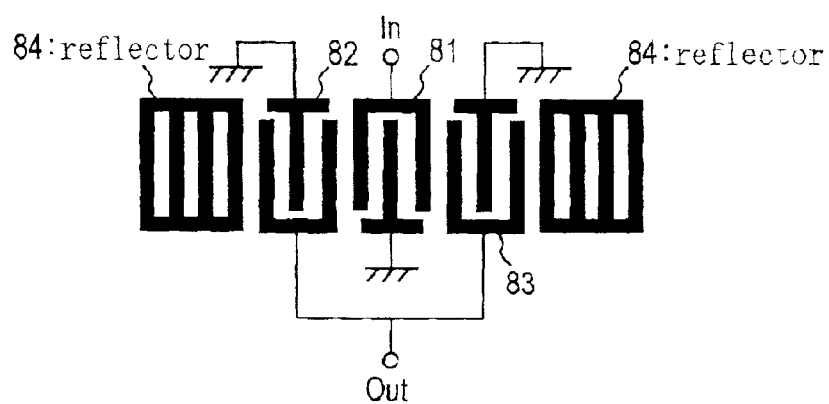
FIG. 11 is a schematic plan view illustrating a structure of a hot and hot connection unbalanced output type SAW filter comprising three IDTs and reflectors on both sides of the IDTs.
Figure 12:
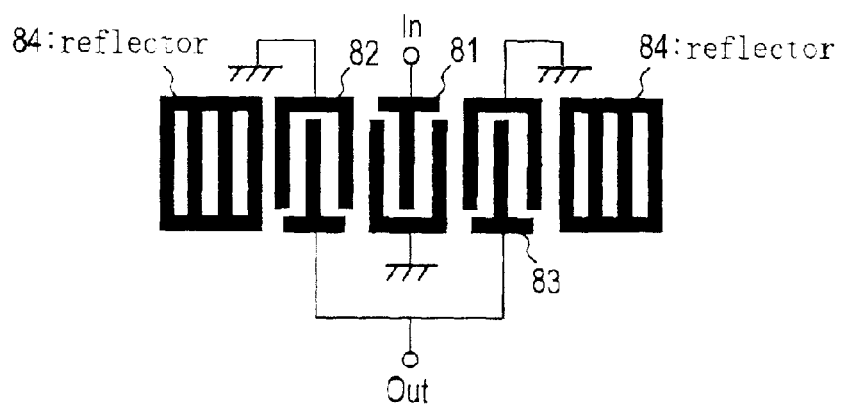
FIG. 12 is a schematic plan view illustrating a structure of a ground and ground connection unbalanced output type SAW filter comprising three IDTs and reflectors on both sides of the IDTs.

As a filter using three IDTs, there is a hot and hot connection unbalanced output type filter comprising three IDTs 81, 82, 83 and reflectors 84, 84 on both sides of the IDTs in FIG. 11, which has a different configuration from the present invention. In many cases, the width W between the input IDT and the output IDT of the filter is set less than $\lambda/2$. However, the problem of the filter whose width between the input IDT and the output IDT is less than $\lambda/2$ can be solved by employing the configuration of the ground and ground connection unbalanced output type filter as shown in FIG. 12. Because the adjacent electrode fingers of the input IDT and the output IDT are grounded in the ground and ground connection unbalanced output type filter, there is no problem in its property even if these electrode fingers are overlapped. Therefore the configuration shown in FIG. 12 can overcome the difficulties in the manufacturing process for the unbalanced type filter using three IDTs whose electrode fingers are too close to each other.

In the SAW filter of the present invention, however, adjacent electrode fingers of the middle IDT 11 and the side IDT 12 and 13 need to establish a hot and hot connection (or a ground and ground connection) and a hot and ground connection. So all of adjacent electrode fingers can not establish a ground and ground connection, that is, the same method applied to the SAW filter in FIG. 12 can not be used to solve the problems. The adjacent electrode fingers of the IDTs in the present invention must be separated.

Figure 13:
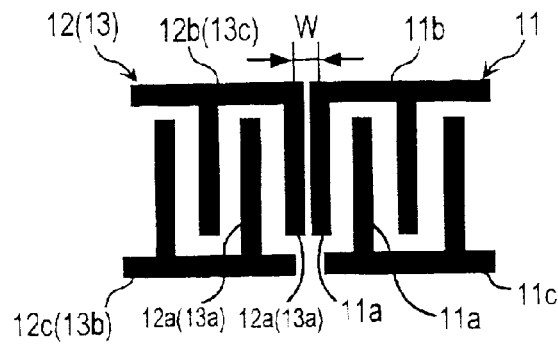
FIG. 13 is a schematic plan view illustrating a state where the width between the input IDT and the output IDT is smaller than $\lambda/2$.

When the SAW filter operates higher frequency, as shown in FIG. 13, the space between the input IDT and the output IDT should be designed to be less than $\lambda/2$. Consequently a space between the adjacent electrode fingers of the IDTs becomes narrow, resulting in difficulties in fabrication. For information, the input IDT 11 comprises comb electrodes 11b and 11c including a plurality of electrode fingers 11a each. The output IDT 12 (13) comprises comb electrodes 12b (13b), 12c (13c) including a plurality of electrode fingers 12a (13a) each.

Figure 14:
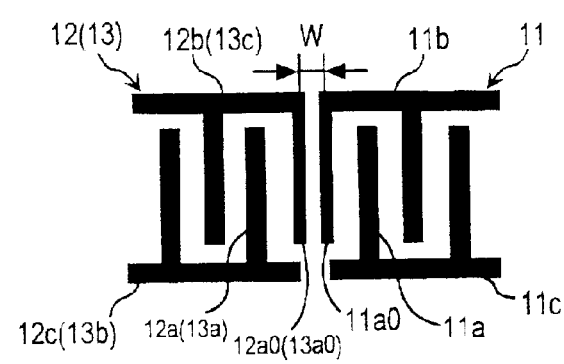
FIG. 14 is a schematic plan view showing a third embodiment of the present invention where the width between the input IDT and the output IDT is smaller than $\lambda/2$.

In a third embodiment shown in FIG. 14, the width of an electrode finger 11a0 of the input IDT 11 and the width of an electrode finger 12a0 (13a0) are designed to be smaller than the width of the other electrode fingers 11a, 12a. By setting the width of electrode finger small, the SAW filter can obtain enough space between the input IDT and the output IDT, resulting in easy fabrication.

Figure 15:
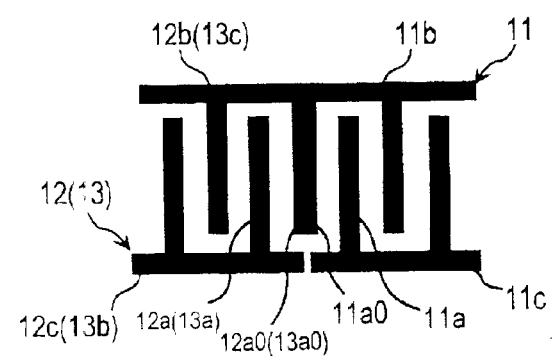
FIG. 15 is a schematic plan view illustrating a state where the width between the input IDT and the output IDT is smaller than $\lambda/2$ and electrode fingers are overlapped.
Figure 16:
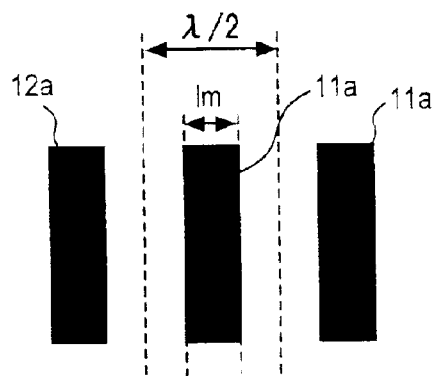
FIG. 16 is a schematic plan view to explain a condition for overlapping the electrode fingers of the input IDT and the output IDT.

When the space between the input IDT and the output IDT becomes even smaller, as shown in FIG. 15, the electrode fingers of the IDTs are overlapped. The conditions for overlapping the electrode fingers 11a and 12a will be explained below with reference to FIG. 16. Given that the metallization ratio of the IDT is expressed by $lm/(\lambda/2)$, the electrode fingers of the IDTs are overlapped and shorted when the space between the input IDT and the output IDT meets the following condition.

Figure 17:
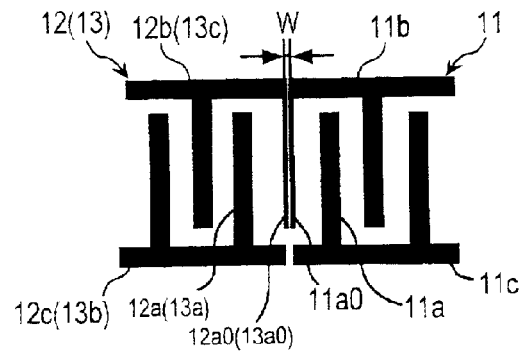
FIG. 17 is a schematic plan view showing the third embodiment of the present invention where the width between the input IDT and the output IDT is smaller than λ/2 and electrode fingers are overlapped.

The distance between the input IDT and the output IDT$\leq\lambda/2-(\lambda/4)\times(lm/(\lambda/2))\times2$ In the case that the space between the input IDT and the output IDT becomes small and the adjacent electrode fingers of both IDTs have no choice but to be overlapped, it is not effective only to make the width of the electrode fingers small as shown in FIG. 17, since the electrode fingers become too slim to fabricate, resulting in the need for highly advanced processing technology.

Figure 18:
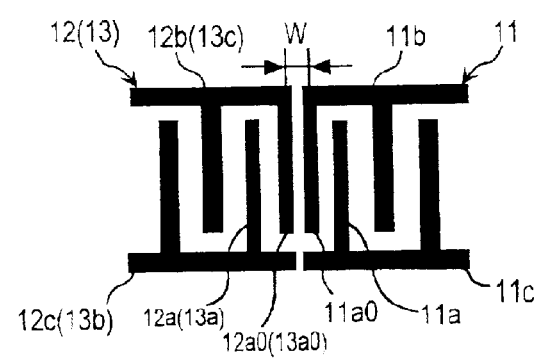
FIG. 18 is a schematic plan view showing a fourth embodiment of the present invention where the width between the input IDT and the output IDT is smaller than λ/2 and electrode fingers are overlapped.

In such a case, the width of the adjacent electrode fingers 12a0, 11a0 of the input IDT and the output IDT is set small while the pitch between the electrode fingers 12a0 and 12 and the pitch between the electrode fingers 11a0 and 11a are set small as shown in a forth embodiment of FIG. 18. To prevent the pitch between the electrode finger 12a and an electrode finger next to it and the pitch between the electrode finger 11a and an electrode finger next to it from being too small, the width of the second electrode fingers 12a and 11a is set small. Thus, the problems can be solved by adjusting the width of the adjacent electrode fingers of the input IDT and the output IDT. Although the width and the pitch are adjusted with respect to the adjacent electrode fingers 12a0 and 11a0 of the input IDT and the output IDT and the electrode fingers 12a and 11a next to those in this embodiment, the width and the pitch are adjustable with respect to electrode fingers next to the second electrode fingers 12a and 11a, if necessary, more than two electrode fingers are adjustable.

Figure 19:
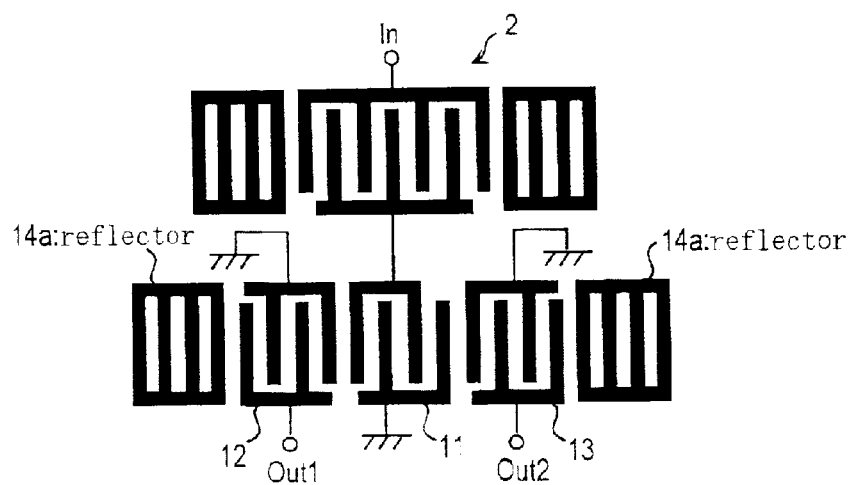
FIG. 19 is a schematic plan view showing the third or fourth embodiment where a one-port SAW resonator is connected to an input side of a longitudinal coupled double mode SAW filter.

FIG. 19 shows a longitudinal double mode SAW filter comprising three IDTs 11, 12, 13 and reflectors 14a, 14b on a 36-degree Y-cut X-propagation LiTaO$_3$ substrate and connecting a one-port SAW resonator 2 in series at the input side of the SAW filter. The filtering properties of the SAW filter applying the method shown in FIG. 14 and the method shown in FIG. 18 are indicated below. In the SAW filter shown in FIG. 19, the electrode fingers in the middle IDT 11 and the IDTs 12 and 13 on both sides are so arranged that adjacent electrode fingers establish a ground and ground connection, and the other adjacent electrode fingers establish a hot and ground connection.

Figure 20:
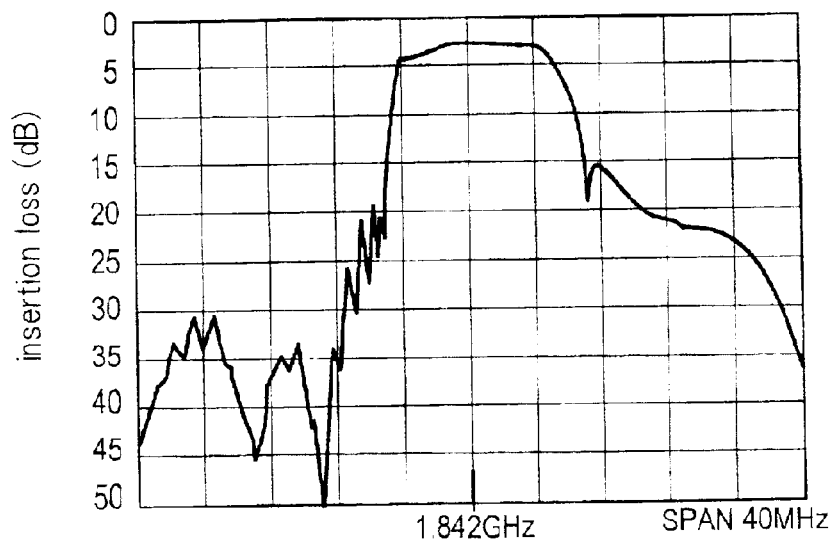
FIG. 20 is a view showing filtering property of a prototype of a longitudinal coupled double mode SAW filter using an electrode configuration of the third embodiment.

FIG. 20 shows the filtering property of a 200 Ω balanced output type SAW filter for PCN (personal communication network)-Rx having the same structure as FIG. 19 applying the method shown in FIG. 14.

The longitudinal coupled double mode SAW filter comprises an IDT 11 including 28 electrode fingers and IDTs 12, 13 each including 20 electrode fingers. The IDT has an aperture length of 150 µm, a pitch between electrode fingers ($\lambda/2$) of 1.07 µm, a space between the input IDT and the output IDT of 0.6 µm. The reflector has 120 electrode fingers, an aperture length of 150 µm, a pitch between electrode fingers ($\lambda/2$) of 1.10 µm. The width of the electrode finger of the IDT is 0.695 µm and the width between adjacent electrode fingers of the input IDT and the output IDT is 0.46 µm.

The one-port SAW resonator comprises an IDT including 251 of the electrode fingers and reflectors each including 150 electrode fingers. A pitch between the IDTs ($\lambda/2$) is 1.06 µm. A pitch between the reflectors ($\lambda/2$) is 1.06 µm. An aperture length of each IDT and reflector is 75 µm.

According to the SAW filter of this embodiment, excellent attenuation can be obtained both at the low-pass side and the high-pass side as indicated in FIG. 20.

Figure 21:
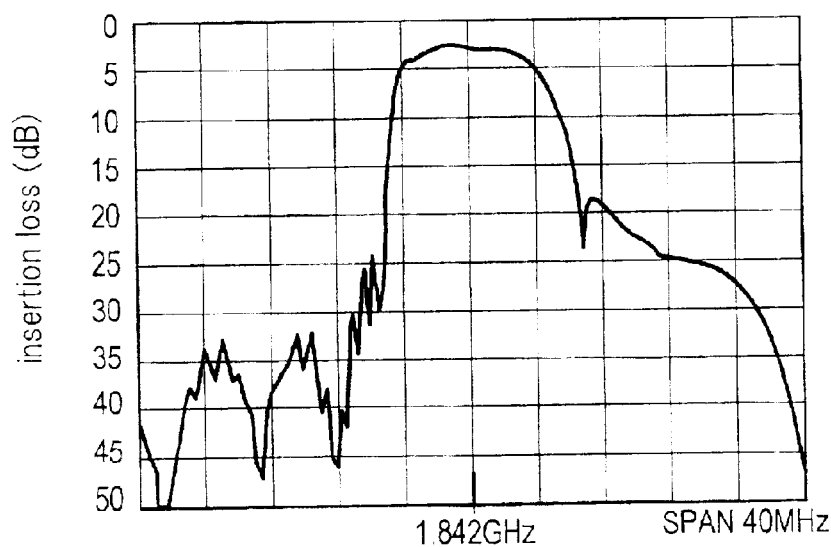
FIG. 21 is a view showing filtering property of a prototype of a longitudinal coupled double mode SAW filter using an electrode configuration of the fourth embodiment.
Figure 22:
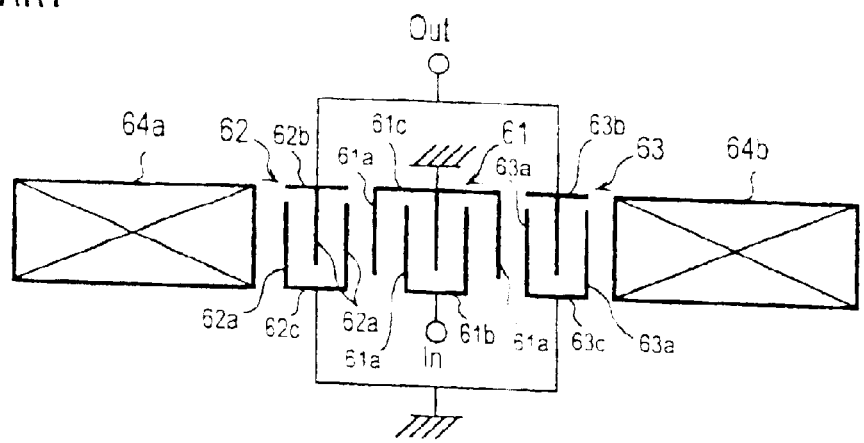
FIG. 22 is a schematic plan view illustrating a longitudinal coupled double mode SAW filter utilizing a conventional longitudinal double mode.
Figure 23:
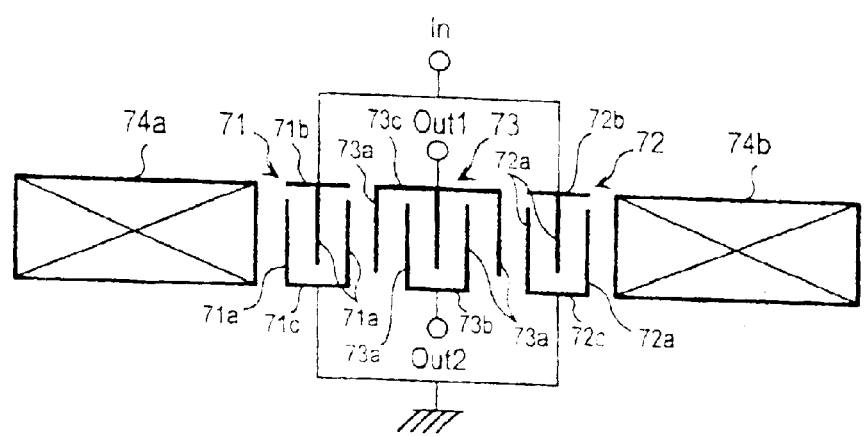
FIG. 23 is a schematic plan view illustrating a longitudinal coupled double mode SAW filter with an unbalanced input and balanced output configuration.

FIG. 21 shows the filtering property of a 200 Ω balanced output type SAW filter for PCS (personal communication service)-Rx having the same structure as FIG. 19 applying the method shown in FIG. 18. The space between the input IDT and the output IDT of the SAW filter is smaller in comparison with the SAW filter in FIG. 20, therefore the method shown in FIG. 18 is applied to the filter to prevent the electrode fingers from being too small.

The IDT 11 of the longitudinal coupled double mode SAW filter comprises 32 electrode fingers and each of the IDT 12, 13 comprises 22 electrode fingers. The IDT has an aperture length of 100 μm, a pitch between the electrode fingers (λ/2) of 1.01 μm a space between the input IDT and the output IDT of 0.6 μm. The reflector comprises 150 electrode fingers, an aperture length of 100 μm, a pitch between the electrode fingers (λ/2) of 1.04 μm. The width of an electrode finger of the input IDT is 0.6 μm. The width of adjacent electrode fingers of the input IDT and the output IDT (the first electrode fingers) is 0.45 μm and a width of electrode fingers next to those (the second electrode fingers) is 0.55 μm. The pitch of the first electrode fingers and the second electrode fingers of the IDT is 0.91 μm.

The one-port SAW resonator comprises an IDT including 301 electrode fingers and reflectors each including 180 electrode fingers. A pitch between the electrode fingers of the IDT (λ/2) is 1.015 μm. A pitch between the electrode fingers of the reflector (λ/2) is 1.015 μm. An aperture length of the IDT and reflectors is 30 μm.

According to the SAW filter of this embodiment, excellent attenuation can be obtained both at low-pass side and high-pass side as indicated in FIG. 21.

The methods in the third and fourth embodiments are also applicable to the hot and hot connection unbalanced output type filter comprising three IDTs flanked by reflectors as shown in FIG. 11.

According to this invention, as described above, an SAW filter having the unbalanced input and balanced output configuration can improve stop-band attenuation and obtain attenuation almost equivalent to that of an SAW filter having the unbalanced input and unbalanced output configuration.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What we claimed is:

1. A longitudinal coupled multiple mode SAW filter comprising a plurality of IDTs disposed along a propagation direction of a surface wave on a piezoelectric substrate, wherein an IDT is flanked on either side by IDTs, a comb electrode of the IDT in the middle is connected with an input terminal, a comb electrode of the IDT on each side of the middle IDT is connected with an output terminal, only the width of adjacent electrode fingers of an input IDT and an output IDT is designed to be smaller than the width of the other electrode fingers.

2. A longitudinal coupled multiple mode SAW filter, comprising a plurality of IDTs disposed along a propagation direction of a surface wave on a piezoelectric substrate, wherein an IDT is flanked on either side by IDTs, a comb electrode of the IDT in the middle is connected with an input terminal, the other comb electrode of the middle IDT is grounded, a comb electrode of the IDT on each side of the middle IDT is connected with an output terminal, the other comb electrodes of the side IDTs are grounded, electrode fingers are so arranged that adjacent electrode fingers of the middle IDT and the IDT on one side make a connection between terminals or a connection between grounds and the other adjacent electrode fingers of the middle IDT and the IDT on the other side make a connection between a terminal and a ground, wherein the width of adjacent electrode fingers of an input IDT and an output IDT is designed to be smaller than the width of the other electrode fingers.

3. The longitudinal coupled multiple mode SAW filter according to claim 2, comprising two reflectors disposed on both sides of a plurality of IDTs along the propagation direction of the surface wave, wherein the reflectors reflect the surface wave and trap oscillation energy of the surface wave between them.

4. The longitudinal coupled multiple mode SAW filter according to claim 2, wherein the pitch between adjacent electrode fingers of the input IDT and the output IDT and electrode fingers next to the adjacent electrode fingers is designed to be narrower than the pitch between the other electrode fingers.

5. The longitudinal coupled multiple mode SAW filter according to claim 4, wherein the width of a plurality of adjacent electrode fingers of the input IDT and the output IDT is designed to be smaller than the width of the other electrode fingers.

6. The longitudinal coupled multiple mode SAW filter according to claim 2, wherein the output terminals are formed facing one direction.

7. A longitudinal coupled multiple mode SAW filter comprising a plurality of IDTs disposed along a propagation direction of a surface wave on a piezoelectric substrate, wherein an IDT is flanked on either side by IDTs, a comb electrode of the IDT in the middle is connected with an input terminal, the other comb electrode of the middle IDT is grounded, a comb electrode of the IDT on each side of the middle IDT is connected with an output terminal, the other comb electrodes of the side IDTs are grounded, electrode fingers are so arranged that adjacent electrode fingers of the middle IDT and the IDT on one side make a connection between terminals or a connection between grounds and the other adjacent electrode fingers of the middle IDT and the IDT on the other side make a connection between a terminal and a ground, wherein the grounds are established facing one direction.

8. A longitudinal coupled multiple mode SAW filter comprising a plurality of IDTs disposed along a propagation direction of a surface wave on a piezoelectric substrate, wherein an IDT is flanked on either side by IDTs, a comb electrode of the IDT in the middle is connected with an input terminal, the other comb electrode of the middle IDT is grounded, a comb electrode of the IDT on each side of the middle IDT is connected with an output terminal, the other comb electrodes of the side IDTs are grounded, electrode fingers are so arranged that adjacent electrode fingers of the middle IDT and the IDT on one side make a connection between terminals or a connection between grounds and the other adjacent electrode fingers of the middle IDT and the IDT on the other side make a connection between a terminal and a ground, wherein the output terminals are mutually formed in opposite directions.

9. A SAW filter comprising a longitudinal coupled multiple mode SAW filter comprising a plurality of IDTs disposed along a propagation direction of a surface wave on a piezoelectric substrate and a resonator which includes one or a plurality of IDTs for exciting and receiving a surface acoustic wave, has antiresonant frequency approximately equivalent to cut-off frequency on the high-pass side of a pass-band of the longitudinal coupled multiple mode SAW filter and connects with the longitudinal coupled multiple mode SAW filter in series, the longitudinal coupled multiple SAW filter wherein an IDT is flanked on either side by IDTs, a comb electrode of the IDT in the middle is connected with an input terminal, the other comb electrode of the middle IDT is grounded, a comb electrode of the IDT on each side of the middle IDT is connected with an output terminal, the other comb electrodes of the side IDTs are grounded, electrode fingers are so arranged that adjacent electrode fingers of the middle IDT and the IDT on one side make a connection between terminals or a connection between grounds and the other adjacent electrode fingers of the middle IDT and the IDT on the other side make a connection between a terminal and a ground, wherein the width of adjacent electrode fingers of an input IDT and an output IDT in the longitudinal coupled multiple mode SAW filter is designed to be smaller than the width of the other electrode fingers.

10. The SAW filter according to claim 9, wherein the longitudinal coupled multiple mode SAW filter comprises two reflectors disposed on both sides of a plurality of IDTs along the propagation direction of the surface wave, and the reflectors reflect the surface wave and trap oscillation energy of the surface wave between them.

11. The SAW filter according to claim 9, wherein the resonator is a one-port resonator.

12. The SAW filter according to claim 9, wherein the resonator comprises two reflectors for reflecting the surface acoustic wave disposed on both sides of one or a plurality of IDTs along the propagation direction of the surface wave.

13. The SAW filter according to claim 9, wherein the output terminals are formed facing one direction.

14. The SAW filter according to claim 9, wherein the pitch between adjacent electrode fingers of the input IDT and the output IDT and electrode fingers next to adjacent the electrode fingers is designed to be narrower than the pitch between the other electrode fingers.

15. The SAW filter according to claim 14, wherein the width of a plurality of adjacent electrode fingers of the input IDT and the output IDT is designed to be smaller than the width of the other electrode fingers.

16. A SAW filter comprising a longitudinal coupled multiple mode SAW filter comprising a plurality of IDTs disposed along a propagation direction of a surface wave on a piezoelectric substrate and a resonator which includes one or a plurality of IDTs for exciting and receiving a surface acoustic wave, has antiresonant frequency approximately equivalent to cut-off frequency on the high-pass side of a pass-band of the longitudinal coupled multiple mode SAW filter and connects with the longitudinal coupled multiple mode SAW filter in series, the longitudinal coupled multiple SAW filter wherein an IDT is flanked on either side by IDTs, a comb electrode of the IDT in the middle is connected with an input terminal, the other comb electrode of the middle IDT is grounded, a comb electrode of the IDT on each side of the middle IDT is connected with an output terminal, the other comb electrodes of the side IDTs are grounded, electrode fingers are so arranged that adjacent electrode fingers of the middle IDT and the IDT on one side make a connection between terminals or a connection between grounds and the other adjacent electrode fingers of the middle IDT and the IDT on the other side make a connection between a terminal and a ground, wherein the output terminals are mutually formed in the opposite directions.

17. A SAW filter comprising a longitudinal coupled multiple mode SAW filter comprising a plurality of IDTs disposed along a propagation direction of a surface wave on a piezoelectric substrate and a resonator which includes one or a plurality of IDTs for exciting and receiving a surface acoustic wave, has antiresonant frequency approximately equivalent to cut-off frequency on the high-pass side of a pass-band of the longitudinal coupled multiple mode SAW filter and connects with the longitudinal coupled multiple mode SAW filter in series, the longitudinal coupled multiple SAW filter wherein an IDT is flanked on either side by IDTs, a comb electrode of the IDT in the middle is connected with an input terminal, the other comb electrode of the middle IDT is grounded, a comb electrode of the IDT on each side of the middle IDT is connected with an output terminal, the other comb electrodes of the side IDTs are grounded, electrode fingers are so arranged that adjacent electrode fingers of the middle IDT and the IDT on one side make a connection between terminals or a connection between grounds and the other adjacent electrode fingers of the middle IDT and the IDT on the other side make a connection between a terminal and a ground, wherein the grounds are established facing one direction.

* * * * *